United States Patent
Choi et al.

(10) Patent No.: US 9,184,090 B2
(45) Date of Patent: Nov. 10, 2015

(54) THIN FILM TRANSISTOR DISPLAY PANEL AND MANUFACTURING METHOD OF THE SAME

(75) Inventors: Seung-Ha Choi, Suwon-si (KR); Kyoung-Jae Chung, Seoul (KR); Woo-Geun Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 306 days.

(21) Appl. No.: 13/151,102

(22) Filed: Jun. 1, 2011

(65) Prior Publication Data

US 2011/0297930 A1 Dec. 8, 2011

(30) Foreign Application Priority Data

Jun. 4, 2010 (KR) .................. 10-2010-0052879

(51) Int. Cl.
*H01L 21/00* (2006.01)
*H01L 21/768* (2006.01)
(Continued)

(52) U.S. Cl.
CPC .... *H01L 21/76804* (2013.01); *G02F 1/133345* (2013.01); *G02F 1/136227* (2013.01); *H01L 21/76816* (2013.01); *H01L 27/1225* (2013.01); *H01L 27/1244* (2013.01); *H01L 27/1248* (2013.01); *H01L 29/4908* (2013.01); *H01L 29/66969* (2013.01); *H01L 29/7869* (2013.01); *H01L 29/78606* (2013.01); *G02F 1/136286* (2013.01)

(58) Field of Classification Search
CPC ................... H01L 21/76804; H01L 21/76816; H01L 27/1225; H01L 29/786; H01L 29/7869; H01L 29/4908; H01L 29/7806; H01L 29/66969; H01L 12/1248; H01L 27/1244

USPC ............ 257/347–352, 43, E29.296; 438/104
See application file for complete search history.

(56) References Cited

U.S. PATENT DOCUMENTS 5,663,077 A * 9/1997 Adachi et al. ................. 438/151
6,563,174 B2   5/2003 Kawasaki et al.
(Continued)

FOREIGN PATENT DOCUMENTS

CN       1786801 A      6/2006
CN     101335304 A     12/2008
(Continued)

OTHER PUBLICATIONS

Hayashi et al., "42.1: Invited Paper: Improved Amorphous In-Ga-Z2-O TFTs"; SID 08 Digest; ISSN/008-0966X/08/3902-0621; pp. 621-624; 2008.

*Primary Examiner* — Richard Booth
(74) *Attorney, Agent, or Firm* — Innovation Counsel LLP

(57) ABSTRACT

A TFT display panel having a high charge mobility and making it possible to obtain uniform electric characteristics with respect to a large-area display is provided as well as a manufacturing method thereof. A TFT display panel includes a gate electrode formed on an insulation substrate, a first gate insulting layer formed of SiNx on the gate electrode, a second gate insulting layer formed of SiOx on the first gate insulting layer, an oxide semiconductor layer formed to overlap the gate electrode and having a channel part, and a passivation layer formed of SiOx on the oxide semiconductor layer and the gate electrode, and the passivation layer includes a contact hole exposing the drain electrode. The contact hole has a shape in which the passivation layer of a portion directly exposed together with a metal occupies an area smaller than the upper passivation layer.

10 Claims, 8 Drawing Sheets

(51) Int. Cl.
*G02F 1/1333* (2006.01)
*G02F 1/1362* (2006.01)
*H01L 27/12* (2006.01)
*H01L 29/49* (2006.01)
*H01L 29/786* (2006.01)
*H01L 29/66* (2006.01)

(56) References Cited

U.S. PATENT DOCUMENTS

| | | | |
|---|---|---|---|
| 6,600,524 | B1 | 7/2003 | Ando et al. |
| 7,906,415 | B2 * | 3/2011 | Li et al. .................. 438/488 |
| 8,093,589 | B2 | 1/2012 | Sugihara et al. |
| 2006/0118793 | A1 | 6/2006 | Yang et al. |
| 2007/0296885 | A1 | 12/2007 | Kim et al. |
| 2008/0023698 | A1 | 1/2008 | Li et al. |
| 2008/0308796 | A1 | 12/2008 | Akimoto et al. |
| 2010/0163874 | A1 * | 7/2010 | Koyama et al. .................. 257/57 |

FOREIGN PATENT DOCUMENTS

| | | |
|---|---|---|
| JP | 11-186243 | 7/1999 |
| JP | 11-204498 | 7/1999 |
| JP | 2001-308182 | 11/2001 |
| JP | 2003-086808 A | 3/2003 |
| JP | 2005011920 A | 1/2005 |
| JP | 2007-073558 | 3/2007 |
| JP | 2007-212699 A | 8/2007 |
| JP | 2007-299913 A | 11/2007 |
| JP | 2009-015101 | 1/2009 |
| JP | 2009-128397 A | 6/2009 |
| JP | 2009-147039 A | 7/2009 |
| JP | 2009-260378 | 11/2009 |
| JP | 2010-045263 | 2/2010 |
| JP | 2010-074138 | 4/2010 |
| JP | 2010-170057 | 8/2010 |
| KR | 1020080068240 A | 7/2008 |
| KR | 1020080104860 A | 12/2008 |
| KR | 1020080110059 A | 12/2008 |
| KR | 1020090041506 A | 4/2009 |
| WO | 98/16867 A1 | 4/1998 |
| WO | 20071058248 A1 | 5/2007 |

* cited by examiner

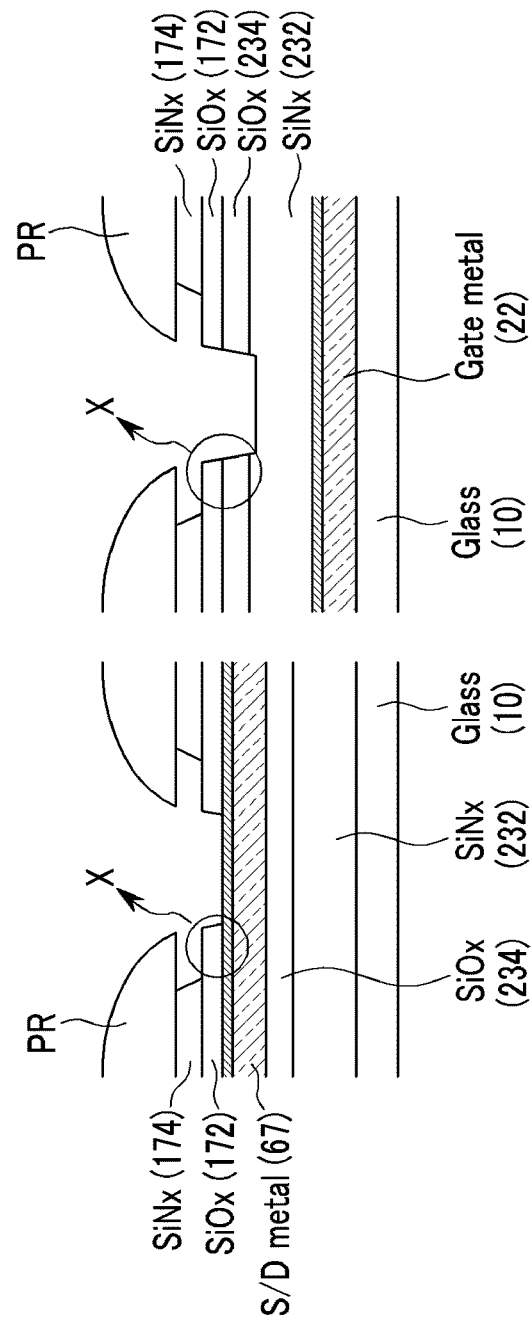

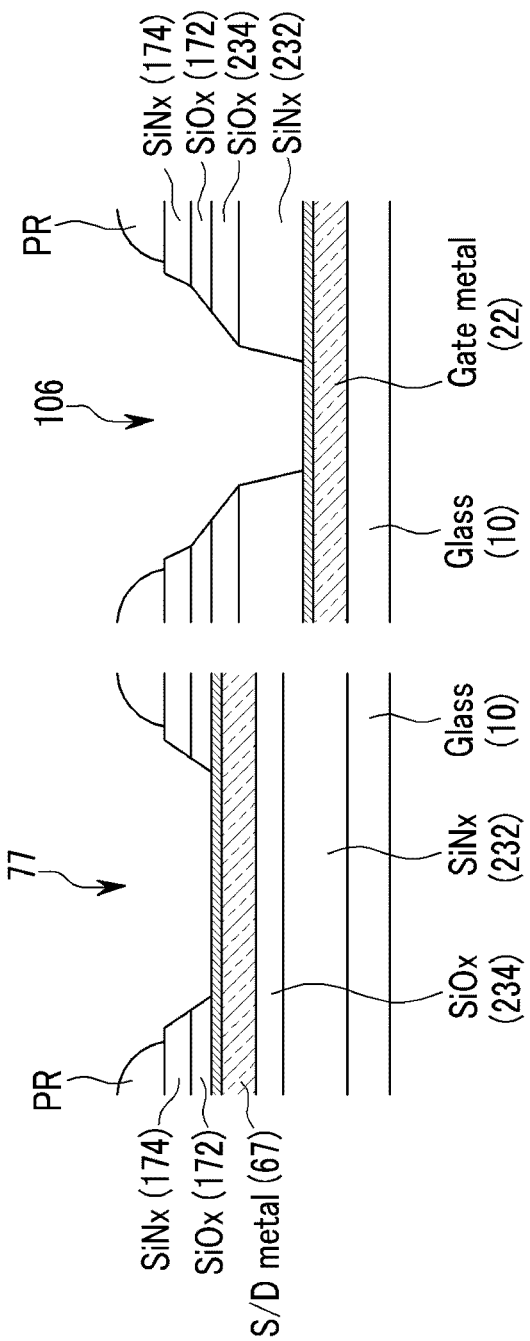

THIN FILM TRANSISTOR DISPLAY PANEL AND MANUFACTURING METHOD OF THE SAME

CROSS-REFERENCE TO RELATED APPLICATION

This application claims priority to and the benefit of Korean Patent Application No. 10-2010-0052879 filed in the Korean Intellectual Property Office on Jun. 4, 2010, the entire contents of which are incorporated herein by reference.

BACKGROUND OF THE INVENTION (a) Field of the Invention

The present invention relates to a thin film transistor display panel and a manufacturing method thereof, and more particularly, to a thin film transistor display panel for a liquid crystal display including an oxide semiconductor layer and a manufacturing method thereof.

(b) Description of the Related Art

A liquid crystal display typically uses an electric field to adjust the light transmittance through a liquid crystal, thereby displaying images. To this end, the liquid crystal display includes a liquid crystal panel in which pixels are arranged in a matrix, and a drive circuit for driving the liquid crystal panel.

The liquid crystal panel includes a thin film transistor (hereinafter, referred to as 'TFT') display panel and a color filter panel that face each other, spacers disposed between the TFT display and color filter panels for maintaining a predetermined cell gap between the two panels, and a liquid crystal layer filling the cell gap.

In general, the TFT display panel includes an array of TFTs and further includes a passivation film for protecting the TFTs, and pixel electrodes electrically connected to the TFTs. In this case, in order to electrically connect the TFTs and the pixel electrodes, contact holes are formed in the passivation film, and such contact holes are generally formed in the passivation film by etching using an etch agent.

However, when the vertical structure of the passivation film with etched openings is unstable, problems may occur in the electrical connection between the TFTs and the pixel electrodes, resulting in errors in the operations of the pixels.

TFTs used in liquid crystal displays are typically classified into amorphous silicon TFTs and polycrystalline silicon TFTs on the basis of the materials constituting channel regions of switching elements. Amorphous silicon TFTs have a low charge mobility, for example, about 0.5 $cm^2/Vs$, but make it possible to realize uniform electric characteristics with respect to a large-area display. In contrast, polycrystalline silicon TFTs have a high charge mobility, for example, several hundred $cm^2/Vs$, but make it difficult to realize uniform electric characteristics with respect to a large-area display.

The above information disclosed in this Background section is only for enhancement of understanding of the background of the disclosure and therefore it may contain information that does not form the prior art that is already known to a person of ordinary skill in the art.

SUMMARY OF THE INVENTION

A TFT display panel is provided having a high charge mobility and that makes it possible to obtain uniform electric characteristics with respect to a large-area display.

Further, a method of manufacturing such a TFT display panel is provided.

In one aspect, a TFT display panel includes a gate electrode formed on an insulation substrate; a first gate insulting layer formed on the gate electrode; a second gate insulating layer formed of at least one of silicon oxide (SiOx), aluminum oxide, titanium oxide, zirconium oxide, hafnium oxide, tantalum oxide, and tungsten oxide on the first gate insulting layer; an oxide semiconductor layer overlapping the gate electrode and having a channel part; a source electrode and a drain electrode formed on the oxide semiconductor layer to be separated from each other; and a passivation layer formed on the source electrode and the drain electrode and having a first contact hole exposing the drain electrode. In the TFT display panel, the first contact hole has a shape in which the cross-sectional area increases from the bottom at the drain electrode upward.

The oxide semiconductor layer may contains an oxide of a material selected from among Zn, In, Ga, Sn, Cd, Ge, Pb, Sr, Ca, Ni, Cu, Sb, Ba, Sc, Y, Nb, Ta, Hf, Nd, metal elements of groups 12, 13, and 14 of the periodic table, and combinations thereof, and the passivation layer may includes a first passivation layer formed of at least one of silicon oxide (SiOx), aluminum oxide, titanium oxide, zirconium oxide, hafnium oxide, tantalum oxide, and tungsten oxide on the oxide semiconductor layer, and a second passivation layer formed of one of SiON, SiNx, and combinations of SiON and SiNx on the first passivation layer.

Further, the sidewall of the first contact hole may have a structure in which a gradient at the first passivation layer is smaller than a gradient at the second passivation layer, and the first gate insulating layer may be formed to have a thickness of about 250 nm to [about] 500 nm, and the second gate insulating layer may be formed to have a thickness of about 30 nm to [about] 100 nm.

The TFT display panel may further include a gate line and a gate pad part both connected to the gate electrode. In this case, the passivation layer, the second gate insulating layer, and the first gate insulating layer have a second contact hole exposing the gate pad part, and the second contact hole may have a shape in which the cross-sectional area increases from the bottom at the gate pad part upward.

In another aspect, a manufacturing method of the TFT display panel is provide which includes forming a gate electrode on an insulation substrate; forming a first gate insulting layer on the gate electrode; forming a second gate insulting layer of at least one of silicon oxide (SiOx), aluminum oxide, titanium oxide, zirconium oxide, hafnium oxide, tantalum oxide, tungsten oxide on the first gate insulting layer; forming an oxide semiconductor layer on the second gate insulting layer; forming a source electrode and a drain electrode on the oxide semiconductor layer to be separated from each other; and forming a passivation layer, which has a first contact hole and contains an oxide, on the source electrode and the drain electrode, in which the first contact hole has a shape in which the cross-sectional area increases from the bottom at the drain electrode upward.

Forming the first contact hole may include etching using etch gas of a $SF_6$ and $O_2$, and an etch using an etch gas comprising a carbon-fluoride gas and $SF_6$ and $O_2$.

The carbon-fluoride gas includes at least one of $C_4F_8$, $C_2F_6$, $CF_4$, and $CHF_3$.

In the TFT display panel, reliability is improved by forming the contact hole exposing the drain electrode expansion part or the contact hole exposing the gate pad part with a structure that has a stable vertical shape in which the cross-sectional areas of the contact holes increase from the bottom surfaces upward.

BRIEF DESCRIPTION OF THE DRAWINGS

FIG. 4A to FIG. 4C are cross-sectional views illustrating a method of forming a gate pad part and a contact hole of a TFT array panel for a liquid crystal display according to an exemplary embodiment and taken along the line A-A' and the line B-B';

DETAILED DESCRIPTION OF THE EMBODIMENTS

Figure 1:
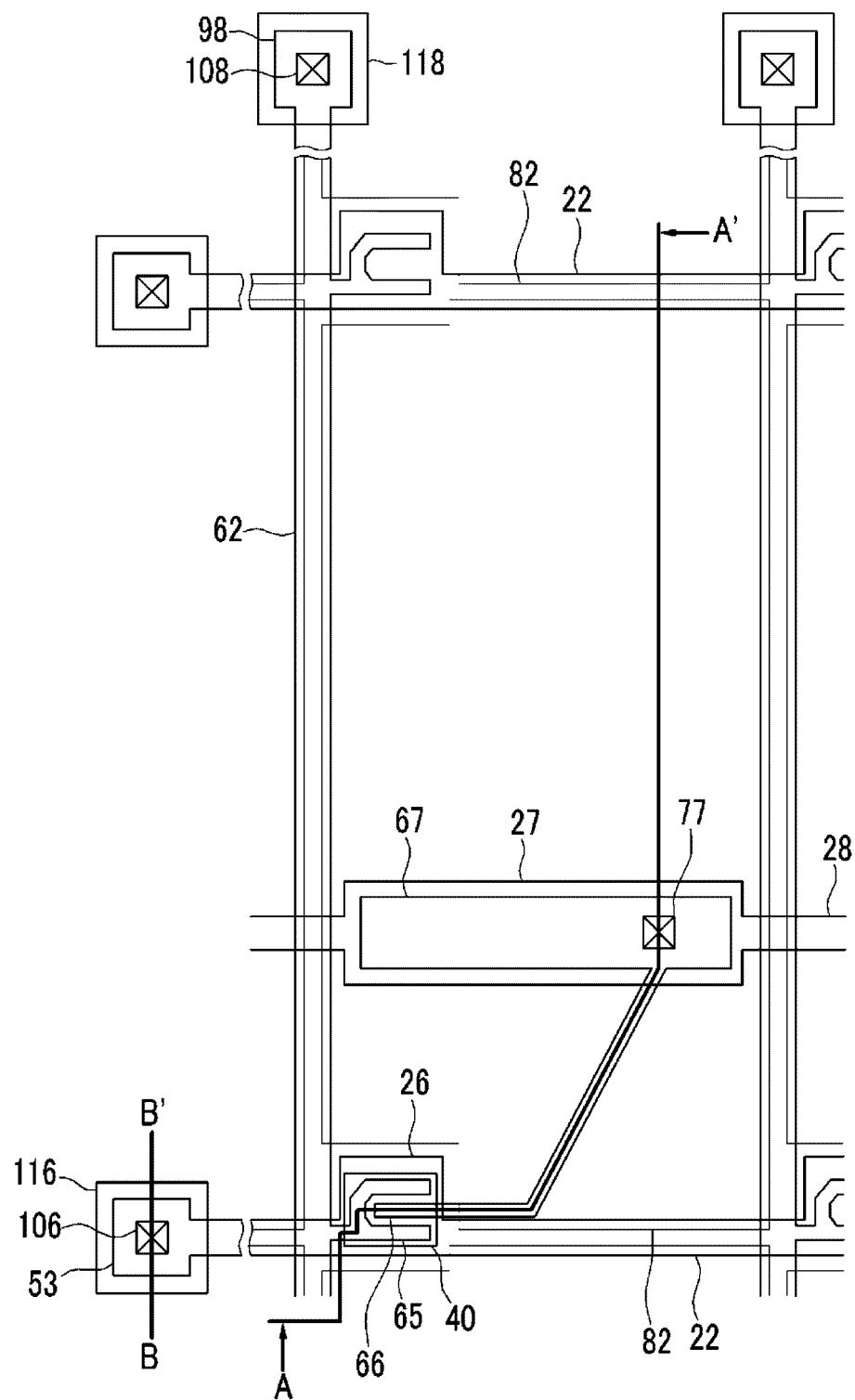
FIG. 1 is a view illustrating a layout of a TFT array panel for a liquid crystal display according to an exemplary embodiment.

The present disclosure will be described more fully hereinafter with reference to the accompanying drawings, in which exemplary embodiments of the invention are shown. As those skilled in the art would realize, the described exemplary embodiments may be modified in various different ways, all without departing from the spirit or scope of the present invention. The drawings and description are to be regarded as illustrative in nature and not restrictive. Like reference numerals designate like elements throughout the specification. Further, a detailed description of well-known techniques is omitted.

In the drawings, the thickness of layers, films, panels, regions, etc., may be exaggerated for clarity. It will be understood that when an element such as a layer, film, region, or substrate is referred to as being "on" another element, it can be directly on the other element, or intervening elements may also be present. On the other hand, when an element is referred to as being "directly on" another element, there are no intervening elements present. It will be understood that when an element such as a layer, film, region, or substrate is referred to as being "below" another element, it can be directly below the other element, or intervening elements may also be present. On the other hand, when an element is referred to as being "directly below" another element, there are no intervening elements present.

First, a TFT array panel for a liquid crystal display according to an exemplary embodiment will be described with reference to FIGS. 1 to 3.

FIG. 1 is a view illustrating a layout of a TFT array panel for a liquid crystal display according to an exemplary embodiment. FIG. 2 is a cross-sectional view of the TFT array panel of FIG. 1 taken along a line A-A'. FIG. 3 is a cross-sectional view of the TFT array panel of FIG. 1 taken along a line B-B'.

Figure 2:
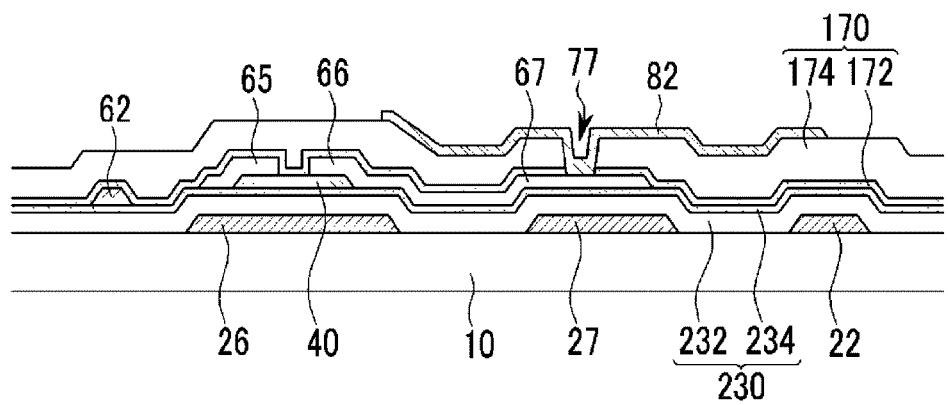
FIG. 2 is a cross-sectional view taken along a line A-A' of FIG. 1.
Figure 3:
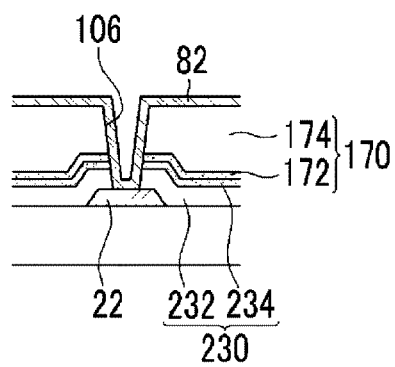
FIG. 3 is a cross-sectional view taken along a line B-B' of FIG. 1.

Referring to FIGS. 1 to 3, a gate wire (22 and 26) for transmitting a gate signal is formed on an insulation substrate 10. The gate wire (22 and 26) includes a gate line 22 extending in a transverse direction, and a gate electrode 26 of a TFT formed to be connected to the gate wire 22 and protruding from gate wire 22.

Further, a storage wire (27 and 28) for transmitting a storage voltage is formed on the insulation substrate 10. The storage wire (27 and 28) includes a storage line 28 formed to be substantially parallel to the gate line 22 across a pixel area, and a storage electrode 27 formed to be wider than the storage line 28 and connected to the storage line 28. The storage electrode 27 overlaps a drain electrode expansion part 67 connected to a pixel electrode 82 (to be described later) so as to form a storage capacitor that improves the charge storage capability. The shapes and positions of the storage electrode 27 and the storage line 28 can be modified in various ways, and when liquid crystal capacitance formed between the pixel electrode 82 and a common electrode (not shown) is sufficient, storage capacitance occurring by the overlap of the pixel electrode 82 and the gate line 22, the storage electrode 27 and the storage line 28 may not be formed.

The gate wire (22 and 26) and the storage wire (27 and 28) may be formed of a metal of an aluminum series such as aluminum (Al) and an aluminum alloy, a metal of a silver series such as silver (Ag) and an silver alloy, a metal of a copper series such as copper (Cu) and an copper alloy, a metal of a molybdenum series such as molybdenum (Mo) and an molybdenum alloy, chromium (Cr), titanium (Ti), tantalum (Ta), etc. Also, the gate wire (22 and 26) and the storage wire (27 and 28) may have a multi-layer structure including two conductive layers (not shown) having different physical properties.

A gate insulating layer 230 is formed on the insulation substrate 10, the storage wire (27 and 28), and the gate wire (22 and 26). The gate insulating layer 230 includes a lower insulating layer 232 formed on the gate line 22, and an upper insulating layer 234 formed on the lower insulating layer 232 so as to be in contact with an oxide semiconductor layer 40. Typically, the lower insulating layer 232 should not be in contact with the oxide semiconductor layer 40. The lower insulating layer 232 may be formed of a nitride, for example, silicon nitride (SiNx), silicon oxynitride (SiON), etc., and may be typically formed of silicon nitride. In order to deter the electric characteristics of the oxide semiconductor layer 40, the upper insulating layer 234 may be formed of an oxide, for example, silicon oxide, aluminum oxide, titanium oxide, zirconium oxide, hafnium oxide, tantalum oxide, tungsten oxide, etc., and may be typically formed of silicon oxide. The lower insulating layer 232 may be formed to have a thickness of about 250 nm to about 500 nm, and the upper insulating layer 234 may be formed to have a thickness of about 30 nm to about 100 nm.

In general, hydrogen reacts with the oxide semiconductor layer 40 to deoxidize the oxide semiconductor layer 40 and to generate oxygen vacancies in the oxide semiconductor layer 40. Those oxygen vacancies increase the carrier concentration of a channel part of the oxide semiconductor layer 40. Therefore, when the gate insulating layer 230 has a high hydrogen content, the carrier concentration increases and thus a threshold voltage Vth of an oxide TFT moves in a negative direction. As a result, the oxide semiconductor layer 40 has the same electric characteristics as a conductor. For this reason, in the case of gate insulating layer 230, because gate insulating layer 230 is brought into contact with the oxide semiconductor layer 40, it is important to reduce the hydrogen content in the gate insulating layer 230.

When the upper insulating layer 234 is formed of an oxide, for example, silicon oxide, because a hydrogen containing gas is not used, but instead, for example, $N_2O$ gas or $O_2$ gas is used as an reaction gas, the hydrogen content in the upper insulating layer 234 is very low. Thus it is possible to deter the electric characteristics of the oxide semiconductor layer 40 from being deteriorated.

On the gate insulating layer 230, the oxide semiconductor layer 40 is formed of an oxide of a material selected from among Zn, In, Ga, Sn, Cd, Ge, Pb, Sr, Ca, Ni, Cu, Sb, Ba, Sc, Y, Nb, Ta, Hf, Nd, metal elements of groups 12, 13, and 14 in the periodic table, and combinations thereof. For example, the oxide semiconductor layer 40 may be formed of a mixed oxide such as ZnO, InZnO, InGaO, InSnO, ZnSnO, GaSnO, GaZnO, GaZnSnO, or GaInZnO. Because the oxide semiconductor layer 40 has an effective charge mobility that is two times to one hundred times greater than that of hydrogenated amorphous silicon, and an on/off current ratio of 105 to 108, it has superior semiconductor characteristics. Further, in the case of the oxide semiconductor layer 40, because the band gap is about 3.0 eV to [about?] 3.5 eV, an optical leakage current does not occur with respect to visible light. Therefore, it is possible to prevent instant afterimage of the oxide TFT, and because it is unnecessary to form a light blocking layer below the oxide TFT, it is possible to increase the aperture ratio of the liquid crystal display. In order to improve the characteristics of an oxide semiconductor, a transition element or an element of groups 3, 4, and 5 in the periodic table may also be included. Further, because the materials forming the oxide semiconductor layer 40 have an ohmic contact characteristic with a data wire (62, 65, 66, and 67) (to be described later), it is unnecessary to form a separate ohmic contact layer. Thus it is possible to reduce process time for fabrication of the TFT. Furthermore, because the oxide semiconductor layer 40 has a high effective charge mobility in spite of the fact that it has an amorphous status, and an existing process of producing amorphous silicon is applicable as it is, it can be applied to a large-area display.

In the case of the oxide TFT according to an exemplary embodiment, the oxide semiconductor layer 40 and the data wire (62, 65, 66, and 67) have different pattern shapes. However, when a 4-sheet mask process is used, the oxide semiconductor layer 40 can be patterned in the substantially same shape as the data wire (62, 65, 66, and 67), except for a channel region of the oxide TFT. This is because the oxide semiconductor layer 40 and the data wire (62, 65, 66, and 67) are patterned by using one etch mask. Although a structure manufactured by a 5-sheet mask process is exemplified in the present exemplary embodiment, the present invention is not limited thereto. As will be apparent to persons of ordinary skill in the art processes other than the 5-sheet mask process, for example, a 3-sheet or 4-sheet mask process, may be applied.

The data wire (62, 65, 66, and 67) is formed on the oxide semiconductor layer 40 and the gate insulating layer 230. The data wire (62, 65, 66, and 67) includes (i) a data line 62 formed in a lengthwise direction so as to intersect with the gate line 22, thereby defining a pixel, (ii) a source electrode 65 extending in a branch from the data line 62 to the top of the oxide semiconductor layer 40, (iii) a drain electrode 66 separated from the source electrode 65 and formed on the top of the oxide semiconductor layer 40 so as to be opposite to the source electrode 65 with respect to the gate electrode 26 creating a channel part of the TFT, and (iv) a large-area drain electrode expansion part 67 extending from the drain electrode 66 and overlapping the storage electrode 27.

The data wire (62, 65, 66, and 67) may be formed of a material brought into direct contact with the oxide semiconductor layer 40 to form an ohmic contact. That is, in order to form an ohmic contact with the oxide semiconductor layer 40, the data wire (62, 65, 66, and 67) may have a single-layer or multi-layer structure formed of nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), tantalum (Ta), etc. Further, an alloy of a metal and one or more elements selected from among titanium (Ti), zirconium (Zr), tungsten (W), tantalum (Ta), niobium (Nb), platinum (Pt), hafnium (Hf), oxygen (O), and nitrogen (N) is applicable.

At least one part of the source electrode 65 overlaps a portion of the oxide semiconductor layer 40, the drain electrode 66 is opposite to the source electrode 65 with respect to the channel part of the oxide TFT, and at least one part of the drain electrode 66 overlaps a different portion of the oxide semiconductor layer 40.

The drain electrode expansion part 67 is formed so as to overlap the storage electrode 27 with the gate insulating layer 230 interposed therebetween, thereby forming a storage capacitor together with the storage electrode 27. When the storage electrode 27 is not included in the TFT display panel, the drain electrode expansion part 67 may also be omitted.

On the data wire (62, 65, 66, and 67) and the oxide semiconductor layer 40 exposed thereby, a passivation layer 170 is formed. As described above with regard to the procedure of forming the gate insulating layer 230, it is important to reduce the hydrogen content in the passivation layer 170 brought into contact with the oxide semiconductor layer 40. Therefore, the passivation layer 170 includes a lower passivation layer 172 brought into contact with the oxide semiconductor layer 40 and an upper passivation layer 174 formed on the lower passivation layer 172 so as to not be in contact with the oxide semiconductor layer 40. In order to deter the electric characteristics of the oxide semiconductor layer 40, the lower passivation layer 172 may be formed of an oxide, for example, silicon oxide, aluminum oxide, titanium oxide, zirconium oxide, hafnium oxide, tantalum oxide, tungsten oxide, etc., and may be typically formed of silicon oxide. The upper passivation layer 174 may be formed of a nitride, for example, silicon nitride, silicon oxynitride (SiON), etc. and may be typically formed of silicon nitride. The lower passivation layer 172 may be formed to have a thickness of about 50 nm to [about?] 400 nm, and the upper passivation layer 174 may be formed to have a thickness of about 50 nm to [about?] 400 nm.

When the lower passivation layer 172 brought into contact with the oxide semiconductor layer 40 is formed of an oxide, for example, silicon oxide, because a hydrogen containing gas is not used, but instead, for example, $N_2O$ gas or $O_2$ gas is used as an reaction gas, the hydrogen content in the lower passivation layer 172 is very low. Thus it is possible to deter the electric characteristics of the oxide semiconductor layer 40 from being deteriorated. In this case, the thickness of the passivation layer formed of only silicon oxide may be 350 nm or greater.

A contact hole 77 exposing the drain electrode expansion part 67 is formed in the passivation layer 170. During the procedure of forming the contact hole 77, a contact hole 106 exposing the gate pad part, as shown in FIG. 3, is also formed.

On the passivation layer 170, the pixel electrode 82 is formed and is electrically connected to the drain electrode 66 through the contact hole 77. The pixel electrode 82 may be formed of a transparent conductor such as ITO (indium tin oxide) or IZO (indium zinc oxide) or a reflective metal such as aluminum.

To form a liquid crystal panel for a liquid crystal display, a color filter panel (not shown) is spaced apart from the TFT display panel and a layer of liquid crystal molecules (not shown) are placed between the two panels. The color filter panel has a common electrode. When a voltage is applied to the pixel electrode 82, the pixel electrode 82 together with the common electrode of the color filter panel generates an electric field across the liquid crystal layer. The electric field across the liquid crystal layer determines the arrangement of the liquid crystal molecules of the liquid crystal layer between the pixel electrode 82 and the common electrode.

In the TFT display panel for a liquid crystal display according to an exemplary embodiment, as described above with regard to the procedure of forming the gate insulting layer 230 and the passivation layer 170, it is important to reduce the hydrogen contents in the passivation layer 170 and the gate insulting layer 230 that is brought into contact with the oxide semiconductor layer 40. Therefore, the passivation layer and the gate insulting layer brought into direct contact with the oxide semiconductor layer 40 are formed in a multi-layer structure that comprises (i) an oxide, for deterring the electric characteristics of the oxide semiconductor layer 40 from being deteriorated and (ii) a nitride, for making fabrication easier. However, if the gate insulting layer 230 and the passivation layer 170 are formed in the multi-layer of the oxide and the nitride, when the contact hole 77 exposing the drain electrode expansion part 67 is formed, the oxide having a relatively low etch speed is in the middle of the multi-layer and thus the vertical structure of the contact hole formed by an etch may have an instable structure, for example, a structure in which a lower width is larger than an upper width. As a result, problems may occur in the electric connection between the TFT and the pixel electrode.

Therefore, in another exemplary embodiment, a process in forming a contact hole in an oxide semiconductor is provided. The etch process for forming the contact hole exposing the drain electrode expansion part is separated to two stages, and thus the contact hole has a stable vertical structure, for example, an inverted trapezoid structure in which the cross-sectional area increases from the bottom of the contact hole (i.e., the section closest to drain electrode expansion part 67 in contact hole 77 or closest to gate line 22 in contact hole 106) toward the top of the contact hole.

Figure 4A:
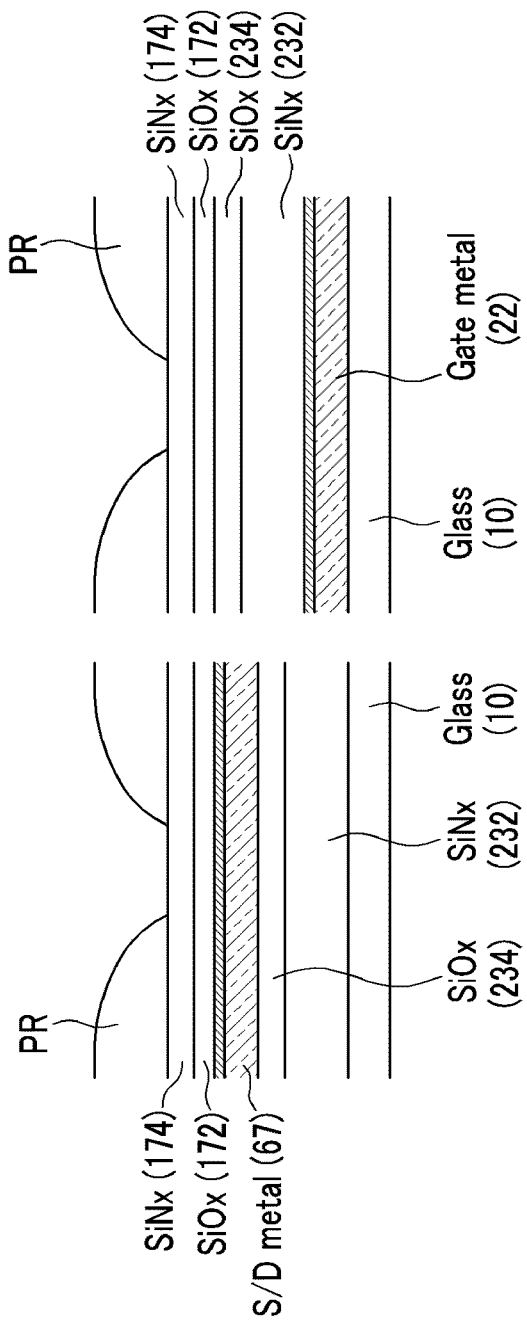

Hereinafter, a method of forming a contact hole in an oxide semiconductor according to another exemplary embodiment will be described with reference to FIGS. 4A to 4C. FIG. 4A is a cross-sectional view illustrating, on the left side of the figure, first steps in forming a contact hole exposing a drain electrode expansion part, such as hole 77 in FIG. 2, and on the right side of the figure, first steps in forming a contact hole exposing the gate pad electrode, such as hole 106 in FIG. 3. The contact hole exposing a drain electrode expansion part is simultaneously patterned when the contact hole exposing the gate pad is formed. FIG. 4B and FIG. 4C are cross-sectional views illustrating formation of the contact hole exposing the gate pad part and the contact hole exposing the drain electrode expansion part after the first contact-hole etch stage and the second contact-hole etch stage, respectively.

First, as shown in FIG. 4A, the gate insulting layer 230 is composed of the lower insulating layer 232 formed on the gate line 22, and the upper insulating layer 234 formed on the lower insulating layer 232. As discuss above with respect to FIGS. 1-3, the lower insulating layer is formed so as to be in contact with the oxide semiconductor layer 40 (not shown in FIGS. 4A-4C) and the lower insulating layer 232 should not be in contact with the oxide semiconductor layer 40. The lower insulating layer 232 may be formed of a nitride, for example, silicon nitride, silicon oxynitride (SiON), etc. and may be typically formed of silicon nitride. In order to deter the electric characteristics of the oxide semiconductor layer 40, the upper insulating layer 234 may be formed of an oxide, for example, silicon oxide, aluminum oxide, titanium oxide, zirconium oxide, hafnium oxide, tantalum oxide, tungsten oxide, etc., and may be typically formed of silicon oxide. The lower insulating layer 232 may be formed to have a thickness of about 250 nm to about 500 nm, and the upper insulating layer 234 may be formed to have a thickness of about 30 nm to about 100 nm.

On the gate insulating layer 230, the data wire (62, 65, 66, and 67) is formed. The drain electrode expansion part 67 is illustrated in FIGS. 4A-4C. As described above, the data wire (62, 65, 66, and 67) may have a single-layer or multi-layer structure formed of nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), tantalum (Ta), etc. Further, an alloy of a metal and one or more elements selected from among titanium (Ti), zirconium (Zr), tungsten (W), tantalum (Ta), niobium (Nb), platinum (Pt), hafnium (Hf), oxygen (O), and nitrogen (N) is applicable.

On the drain electrode expansion part 67 the passivation layer 170 is formed. As described above, it is important to reduce the hydrogen content in the passivation layer 170 brought into contact with the oxide semiconductor layer 40 (not shown in FIGS. 4A to 4C). Therefore, the passivation layer 170 includes the lower passivation layer 172 brought into contact with the oxide semiconductor layer 40 and the upper passivation layer 174 formed on the lower passivation layer 172 so as to not be in contact with the oxide semiconductor layer 40. In order to deter the electric characteristics of the oxide semiconductor layer 40, the lower passivation layer 172 may be formed of an oxide, for example, silicon oxide, aluminum oxide, titanium oxide, zirconium oxide, hafnium oxide, tantalum oxide, tungsten oxide, etc., and may be typically formed of silicon oxide. The upper passivation layer 174 may be formed of a nitride, for example, silicon nitride, silicon oxynitride (SiON), etc. and may be preferably formed of silicon nitride. The lower passivation layer 172 may be formed to have a thickness of about 250 nm to about 500 nm, and the upper passivation layer 174 may be formed to have a thickness of about 30 nm to about 100 nm.

When the lower passivation layer 172 brought into contact with the oxide semiconductor layer 40 is formed of an oxide, for example, silicon oxide, because a hydrogen containing gas is not used but, instead, for example, $N_2O$ gas or $O_2$ gas is used as a reaction gas, the hydrogen content in the lower passivation layer 172 is very low. Thus it is possible to deter the electric characteristics of the oxide semiconductor layer 40 from being deteriorated. In this case, the thickness of the passivation layer formed of only silicon oxide may be 350 nm or greater.

In order to form the contact hole 77 exposing the drain electrode expansion part 67 and contact hole 106 exposing the gate pad electrode 22, a photosensitive resist is applied on the entire passivation layer 170 and then an exposing and developing process is performed to form a photosensitive film pattern PR, as shown in FIG. 4A.

Subsequently, as shown in FIG. 4B, the first contact-hole etch stage is performed by using a dry etch. The first contact-hole etch stage according to an exemplary embodiment uses a dry etch using a $SF_6$ and $O_2$ as an etch agent. A gas of the $SF_6$ and $O_2$ is used as a main etch agent, and $N_2$, Ar, He, $H_2$, etc. may be added as a functional gas. Referring to FIG. 4B, the first contact-hole etch stage progresses by using an etch gas of $SF_6$ and $O_2$ as the etch agent before a lower nitride layer of the gate pad part is etched. That is, the first contact-hole etch stage uses the etch gas of $SF_6$ and $O_2$ and simultaneously a process window expansion to a high process pressure is possible. Thus, the production time can be significantly reduced.

Next, as shown in FIG. 4C, the second contact-hole etch stage is performed, also by using a dry etch. The second contact-hole etch stage uses a dry etch process in which a carbon-fluoride gas is used as an etch agent in addition to the gas of $SF_6$ and $O_2$ used in the first contact-hole etch stage. Here, carbon-fluoride gas used as the etch agent may include compounds containing C and F such as, for example, $C_4F_8$, $C_2F_6$, $CF_4$, and $CHF_3$. The carbon-fluoride gas is used, along with $SF_6$ and $O_2$, as a main etch gas, and $N_2$, Ar, He, $H_2$, etc. may be added as a functional gas.

Figure 5:
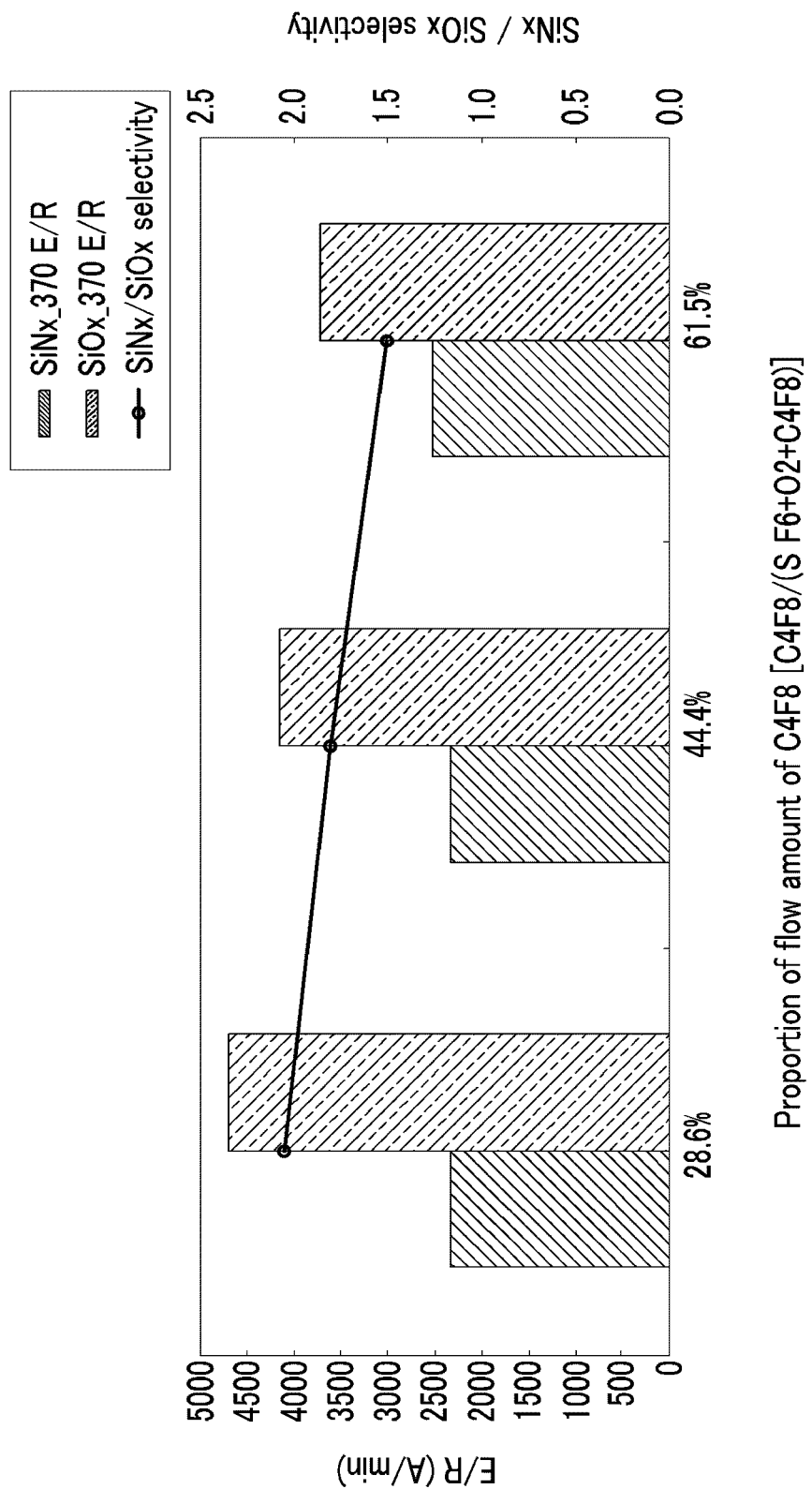
FIG. 5 is a graph illustrating relative etch speeds of SiNx and SiOx and an etching selectivity according to a proportion of etch gas.

FIG. 5 is a graph illustrating an etch speed (E/R (A/min)) of SiNx, an etch speed of SiOx, and an etching selectivity (the etch speed of SiNx/the etch speed of SiOx) when $C_4F_8$, as the carbon-fluoride gas, is used together with the gas of $SF_6$ and $O_2$. As shown in FIG. 5, it can be seen that, as the proportion of the carbon-fluoride gas is increased, the etch speed of SiNx decreases, and the selectivity decreases.

Therefore, the second contact-hole etch stage uses an etch gas containing a carbon-fluoride gas in addition to the etch gas of $SF_6$ and $O_2$ series, as the etch agent. In this case, it is typical that the etching selectivity of the oxide and the nitride forming the gate insulating layer 230 and the passivation layer 170 should be adjusted to 2 or less, and the proportion of the flow amount of the carbon-fluoride gas should be 25% or more of the total flow amount.

Referring to FIG. 4C, when the second contact-hole etch stage is performed by using the carbon-fluoride gas in addition to the etch gas of $SF_6$ and $O_2$ series, as the etch agent, an oxide tip region (X in FIG. 4B]) formed in the first contact-hole etch stage due to an etch speed difference of the oxide and the nitride is removed. Furthermore, because the etching selectivity of the oxide and the nitride is not large, it is possible to prevent an undercut of the nitride layer below the oxide from occurring. That is, a contact hole having a stable vertical structure in which the cross-sectional area increases from the bottom upward is formed. If the second contact-hole etch stage is performed as described above, as shown in FIG. 4C, an inverted trapezoid contact hole is formed, and the sidewall of the contact hole has a structure in which a gradient at the silicon nitride layer is smaller than a gradient at the silicon oxide layer. Because the contact hole exposing the gate pad part passes through the silicon nitride layer, the silicon oxide layer, and the silicon nitride from the bottom, in the sidewall of the contact hole, a first slope, a second slope gentler than the first slope, and a third slope steeper than the second slope appear sequentially. Here, the third slope may have the same gradient as the first slope. The first slope and the third slope are formed to have a gradient of 30° to 80° with respect to the bottom surface of the contact hole, and the second slope is formed to have a gradient of 10° to 70° with respect to the bottom surface of the contact hole.

Figure 6A:
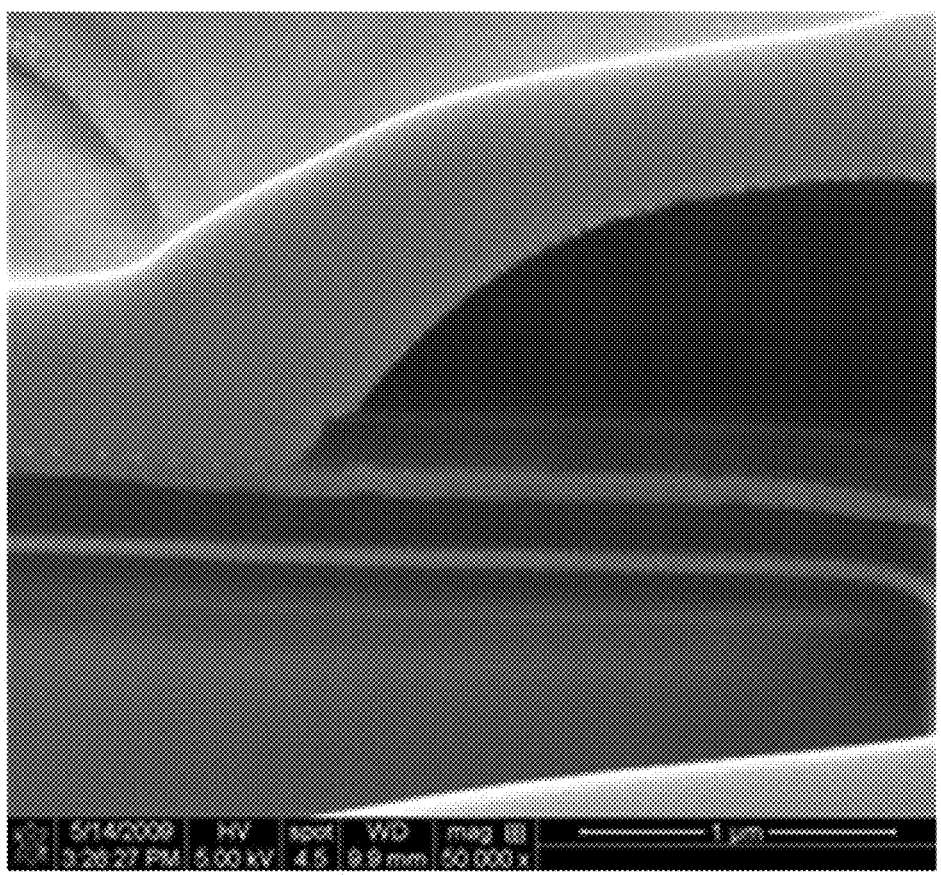
FIGS. 6A and 6B are cross-sectional photographs acquired by an electron microscope for measuring a contact hole region (FIG. 6A) and a gate pad part region (FIG. 6B) after a contact hole etch is performed in an actual process.
Figure 6B:
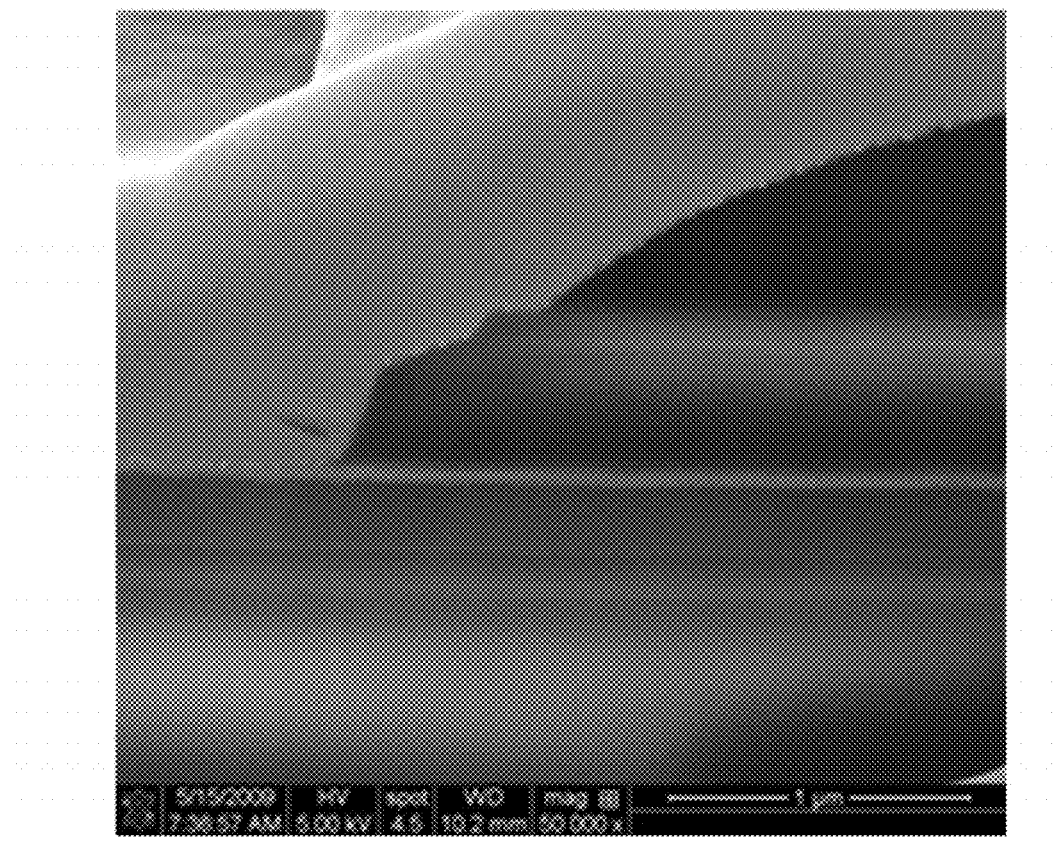

As a result, referring to FIGS. 6A and 6B, it can be seen that the contact hole exposing the drain electrode expansion part (FIG. 6A) or the contact hole exposing the gate pad part (FIG. 6B) has a structure in which the cross-sectional area gradually increases from the bottom surface of the contact hole upward. The contact hole exposing the drain electrode expansion part in FIG. 6A has the same layer structure as shown in FIG. 4A and the contact hole exposing the gate pad part in FIG. 6B has the same layer structure as shown in FIG. 4B.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the disclosure, including the appended claims.

<Description of symbols>

| | |
|---|---|
| 22, 26: Gate wire | 27, 28: Storage wire |
| 67: Drain electrode expansion part | 82: Pixel electrode |
| 230: Gate insulating layer | 40: Oxide semiconductor layer |
| 170: Passivation layer | 77, 106: Contact hole |

What is claimed is:

1. A TFT display panel comprising:
a gate line having a gate pad part, connected to a gate electrode and disposed on an insulation substrate;
a first gate insulating layer disposed on the gate line and the gate electrode and comprising silicon nitride(SiNx);
a second gate insulating layer disposed on the first gate insulting layer and comprising silicon oxide(SiOx);
an oxide semiconductor layer overlapping the gate electrode and having a channel part;
a source electrode and a drain electrode disposed on the oxide semiconductor layer to be separated from each other;
a first passivation layer disposed on the source electrode and the drain electrode and comprising silicon oxide (SiOx); and
a second passivation layer disposed on the first passivation layer and comprising silicon nitride(SiNx),
wherein the second passivation layer, the first passivation layer, the second gate insulating layer, and the first gate insulating layer have a contact hole exposing the gate pad part, and
the contact hole has a shape in which the cross-sectional area increases from the bottom surface at the gate pad part upward.

2. The TFT display panel of claim 1, wherein:
the oxide semiconductor layer comprises an oxide of a material selected from among Zn, In, Ga, Sn Cd, Ge, Pb, Sr, Ca, Ni, Cu, Sb, Ba, Sc, Y, Nb, Ta, Hf, Nd, metal elements of groups 12, 13, and 14 of the periodic table, and combinations thereof.

3. The TFT display panel of claim 1, wherein:
a sidewall of the first contact hole has a structure in which a gradient at the first passivation layer is smaller than a gradient at the second passivation layer.

4. The TFT display panel of claim 2, wherein:
the first gate insulating layer has a thickness of about 250 nm to about 500 nm, and the second gate insulating layer has a thickness of about 30 nm to about 100 nm.

5. The TFT display panel of claim 1, wherein:
the second passivation layer and the first passivation layer have a first contact hole exposing the drain electrode, and
the first contact hole has a shape in which the cross-sectional area increases from the bottom surface at the drain electrode upward.

6. The TFT display panel of claim 5, wherein:
a sidewall of the first contact hole has a first slope, a second slope less steep than the first slope, and a third slope steeper than the second slope from the bottom surface upward.

7. The TFT display panel of claim 6, wherein:
the first gate insulating layer has a thickness of about 250 nm to about 500 nm, and the second gate insulating layer has a thickness of about 30 nm to about 100 nm.

8. The TFT display panel of claim 1, wherein:
the first gate insulating layer has a thickness of about 250 nm to about 500 nm, and the second gate insulating layer may be formed to have a thickness of about 30 nm to about 100 nm.

9. The TFT display panel of claim 1, wherein:
sidewalls of the passivation layer at the first contact hole form an inverted trapezoidal shape.

10. The TFT display panel of claim 5, further comprising:
a pixel electrode layer formed from a transparent conductive material disposed on the second passivation layer; wherein
the transparent conductive material in the first contact hole has a vertical structure in an inverted trapezoidal shape.

* * * * *